United States Patent
Beattie et al.

(10) Patent No.: US 9,542,351 B2
(45) Date of Patent: Jan. 10, 2017

(54) MEMORY CONTROLLER, COMPUTING DEVICE WITH A MEMORY CONTROLLER, AND METHOD FOR CALIBRATING DATA TRANSFER OF A MEMORY SYSTEM

(75) Inventors: Derek Beattie, Giffnock (GB); Rakesh Pandey, Indirapuram Ghaziabad (IN); Deboleena Sakalley, Indirapuram Ghaziabad (IN)

(73) Assignee: NXP USA, INC., Austin, TX (US)

( * ) Notice: Subject to any disclaimer, the term of this patent is extended or adjusted under 35 U.S.C. 154(b) by 25 days.

(21) Appl. No.: 14/401,162

(22) PCT Filed: Jun. 15, 2012

(86) PCT No.: PCT/IB2012/053028
§ 371 (c)(1),
(2), (4) Date: Nov. 14, 2014

(87) PCT Pub. No.: WO2013/186596
PCT Pub. Date: Dec. 19, 2013

(65) Prior Publication Data
US 2015/0134890 A1 May 14, 2015

(51) Int. Cl.
*G06F 13/42* (2006.01)
*G11C 29/02* (2006.01)
(Continued)

(52) U.S. Cl.
CPC ....... *G06F 13/4234* (2013.01); *G06F 12/0246* (2013.01); *G11C 29/022* (2013.01);
(Continued)

(58) Field of Classification Search
CPC .... G06F 13/1689; G06F 1/06; G06F 13/4234; G06F 12/0246; G06F 2212/7201; G11C 2207/2254; G11C 2211/4061; G11C 7/222; G11C 29/028; G11C 29/022
(Continued)

(56) References Cited

U.S. PATENT DOCUMENTS

| 6,735,709 B1 | 5/2004 | Lee et al. |
| 7,742,359 B2 | 6/2010 | Nam |

(Continued)

OTHER PUBLICATIONS

International Search Report and Written Opinion correlating to PCT/IB2012/053028 dated Jan. 31, 2013.

(Continued)

*Primary Examiner* — Mardochee Chery (57) ABSTRACT

A memory controller comprises a connection interface connected or connectable to a memory. The memory controller is arranged to read data from the memory via the connection interface. The memory controller further comprises a clock unit arranged to provide a data transfer clock signal having a first frequency. The data transfer clock signal may be provided to the memory via the connection interface. The data transfer clock signal is arranged for clocking a data transfer from the memory to the memory controller via the connection interface as well as an oversampling circuit arranged to sample a calibration data pattern read by the memory controller via the connection interface at a second frequency to provide an over-sampled calibration data pattern. The second frequency is larger than the first frequency. The memory controller is arranged to determine a timing shift of a data transfer from the memory to the memory controller based on the oversampled calibration data pattern.

19 Claims, 3 Drawing Sheets

(51) Int. Cl.
*G06F 12/02* (2006.01)
*G11C 11/406* (2006.01)
*G06F 3/06* (2006.01)
*G06F 13/16* (2006.01)
*G06F 1/06* (2006.01)

(52) U.S. Cl.
CPC .............. *G11C 29/028* (2013.01); *G06F 1/06* (2013.01); *G06F 3/0629* (2013.01); *G06F 13/1689* (2013.01); *G06F 2212/7201* (2013.01); *G11C 11/40611* (2013.01); *G11C 11/40615* (2013.01); *G11C 2207/2254* (2013.01); *G11C 2211/4061* (2013.01)

(58) Field of Classification Search
USPC ........................................................ 711/103
See application file for complete search history.

(56) References Cited

U.S. PATENT DOCUMENTS

| | | | |
|---|---|---|---|
| 7,872,494 B2* | 1/2011 | Welker | H03K 5/1565 326/30 |
| 7,889,594 B2 | 2/2011 | Yoon et al. | |
| 2005/0185498 A1 | 8/2005 | Keeth et al. | |
| 2006/0193413 A1* | 8/2006 | Shandilya | H03K 5/135 375/355 |
| 2007/0217559 A1* | 9/2007 | Stott | G11C 7/1051 375/355 |

OTHER PUBLICATIONS

Lee et al: :Self-Calibrating Memory Controllers, Webpage: http://electronicdesign.com/article/digital/Self-Calibrating-Memory-Controllers.aspx, Published: May 16, 2011.

* cited by examiner

Fig. 1

| 10 | 12 | 14 | 16 |

Fig. 2

| 1 | 0 | 1 | ← 50

| 1 | 1 | 1 | 1 | 0 | 0 | 0 | 0 | 1 | 1 | 1 | 1 | ← 52

| 0 | 1 | 1 | 1 | 1 | 0 | 0 | 0 | 0 | 1 | 1 | 1 | ← 54

| 0 | 0 | 1 | 1 | 1 | 1 | 0 | 0 | 0 | 0 | 1 | 1 | ← 56

| 1 | 1 | 1 | 0 | 0 | 0 | 0 | 1 | 1 | 1 | 1 | 0 | ← 58

MEMORY CONTROLLER, COMPUTING DEVICE WITH A MEMORY CONTROLLER, AND METHOD FOR CALIBRATING DATA TRANSFER OF A MEMORY SYSTEM

FIELD OF THE INVENTION

This invention relates to a memory controller, a computing system with a memory controller, as well as a method for calibrating data transfer of a memory system.

BACKGROUND OF THE INVENTION

Modern memory for a computer system is accessed with higher and higher frequencies, increasing the importance of synchronization and timing issues, in particular, when reading data from a memory. A memory controller may be utilized to provide a data transfer clock signal to a memory for clocking a data transfer from the memory to the memory controller. Due to effects on the timing of signals in the read path between the memory and the memory controller, there may occur timing shifts between the data transfer clock signal and the data received by the memory controller. Timing shifts, e.g., phase shifts between data received by a memory controller and a clock signal of the memory controller, may occur during data transfer, in particular due to differences in implementation, temperature effects and/or voltage effects. Such timing issues are of particular importance for DDR memory (double data rate memory), which requires strict control of clocking data transfer, as data is transferred both on rising and falling edges of a clock signal. Measuring and/or determining and/or correcting for such timings shifts may be considered to be calibrating data transfer between a memory and a memory controller or calibrating data transfer of a memory system. In the field of serial flash memory, in particular, DDR serial flash memory, there is not defined a standard method of calibrating the data transfer.

SUMMARY OF THE INVENTION

The present invention provides a memory controller, a computing system, and a method for calibrating data transfer of a memory system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGS. are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

The following is generally applicable to the examples described herein below.

In the context of this specification, a memory controller may be considered to comprise a logical circuit arranged to manage a flow of data going to and from a memory. The memory controller may be provided on a separate chip. The memory controller may be implemented as part of a System-on-a-chip (SOC), e.g. in a microcontroller, digital signal processor or general purpose microprocessor, for example on the same die as other electronic circuits of the SoC.

A memory controller may be arranged to provide a processor and/or registers of a processor and/or a cache connected to a processor with data from a memory. The memory controller may comprise a connection interface via which the memory may be connected or connectable to the memory controller. The memory controller may be arranged to read and write data to a memory, in particular via a connection interface. The memory controller may e.g. be arranged to provide a data transfer clock signal to the memory via the connection interface and/or to sample and/or read data from the memory based on the data transfer clock signal. The memory controller may comprise and/or be arranged to access one, or more than one, registers.

The memory controller may provide and/or be provided with a clock signal and be arranged to adapt the clock signal in a suitable manner to provide the data transfer clock signal, e.g. by dividing it using a frequency divider and/or shifting it in phase and/or timing. A clock signal may, e.g., be provided by a clock unit of the memory controller. The clock signal can e.g. be provided to the clock unit of the memory controller by a clock of an on-chip or off-chip external device, e.g. by a processor clock and/or system clock provided on the same die. The data transfer clock signal may be identical to the clock signal.

The data transfer clock signal may be arranged to define the timing of data transfer between the memory and the memory controller and/or the timing of data sampling for data read via the connection interface. The clock frequency of the data transfer clock signal may define a data transfer signal frequency. A data transfer signal frequency may be in a range between 10 MHz and several hundred MHz, in particular between 10 MHz and 300 MHz. The data transfer signal frequency may in particular be around 33 MHz, 50 MHz, 66 MHz, 80 MHz, 83 MHz, 100 MHz, 133 MHz, 166 MHz, or 233 Mhz.

The memory controller may comprise an instruction set comprising one or more instructions. The instructions may comprise at least a calibration instruction. The calibration instruction may be a flexible instruction. A flexible instruction may comprise at least one parameter block referring to modifiable data, in particular a modifiable data pattern. The data pattern may be a reference data pattern. A data pattern intended for calibration correspondingly may generally be referred to as calibration data pattern. A data pattern may generally comprise a sequence of bits, which may be predetermined. In particular, a calibration data pattern may comprise a predetermined sequence of bits, which may be used for calibrating a data transfer. A reference data pattern may provide a data pattern to be written to a memory location which is later read by the memory controller as calibration data pattern. Performing a calibration may comprise reading, by a memory controller, a calibration data pattern from memory and to determine a timing shift based on the calibration data pattern. In particular, performing a calibration may comprise carrying out a calibration instruction. The memory controller may be arranged to compare the reference data pattern with the calibration data pattern.

For example, the data pattern may be a data pattern to be written to and/or read from a memory location of a memory, in particular for the purpose of calibrating data transfer. For example, the memory may have a preprogrammed memory location, e.g. a memory location into which a predetermined data pattern has been written, e.g., reference data pattern intended to be read as calibration data pattern. The predetermined data pattern may be a data pattern written to memory by the memory controller or by another device or method, e.g. according to an application, and in particular may be a modifiable and/or erasable data pattern.

The memory controller may comprise a sampling circuit arranged to sample data read from memory based on a clock signal, in particular based on the data transfer clock signal. The memory controller may comprise a comparator unit arranged to compare shifted data patterns with an oversampled calibration data pattern read from memory via the connection interface. The memory controller can e.g. be arranged to control data transfer, in particular read data transfer, based on a timing shift determined. The timing shift may be represented for example by the value of a status register value indicating a timing shift. Controlling data transfer may in particular comprise shifting a sampling window of a sampling circuit for sampling data read via the connection interface to compensate for a determined shift in timing.

An oversampling circuit may generally be arranged to sample a signal, in particular a data pattern, at a higher frequency than the frequency associated to the signal, in particular a frequency of a data transfer clock signal, i.e., a data transfer signal frequency. The oversampling circuit may be arranged to sample a signal at an oversampling frequency. The oversampling frequency may be higher than the data transfer signal frequency. The oversampling frequency may be a multiple N of the data transfer signal frequency, in particular an integer multiple of the data transfer signal frequency. The oversampling frequency may for example be at least 3×, 4×, 5×, 6× or 8× the data transfer signal frequency. The oversampling frequency may be derived from a frequency on which a clock signal and/or a data transfer clock signal is based. For example, an oversampling frequency may be provided by a clock or frequency source which also provides a signal to be divided in frequency to serve as data transfer clock signal. A signal and/or data pattern sampled by the oversampling circuit may generally be referred to as oversampled signal and/or oversampled data pattern. The oversampling circuit may be arranged to resolve an oversampled data pattern or signal sufficiently to determine a timing shift of data transfer.

The memory controller may be arranged to utilize the oversampling circuit selectively, e.g., when performing calibration. In particular, the memory controller may be arranged to turn on the oversampling circuit for performing calibration, and to turn it off otherwise. the oversampling circuit may e.g. be arranged such that it can be driven with a lower frequency, e.g., the data transfer signal frequency. In this case the oversampling circuit may be arranged to serve as a sampling circuit sampling data when no calibration is performed. A preprogrammed memory location can e.g. refer to a memory location into which a predetermined data pattern has been written, e.g., a reference data pattern intended to be read as calibration data pattern. The predetermined data pattern may be a data pattern written to memory by the memory controller or by another device or method, e.g. according to an application, and in particular may be a modifiable and/or erasable data pattern.

The memory controller may be used in a memory system which comprises a memory controller and a memory connected to the memory controller via a connection interface. The memory system can e.g. be part of a computing system. The connection interface may comprise one or more pins and/or data lines via which a memory controller may be connected or connectable to a memory. The connection interface in particular may be a serial connection. The connection interface may e.g. comprise a Serial Peripheral Interface (SPI)-bus or a bus based on a SPI bus. In particular, the connection interface may comprise a plurality of data pins for data transfer, which may be unidirectional or bidirectional. The connection interface may e.g. comprise at least one pin via which a data transfer clock signal may be provided to a memory.

A memory controller may comprise an instruction set storage device. An instruction set storage device may be arranged to store a set of instructions, which the memory controller may be arranged to carry out and/or execute. The instruction set may comprise one or more instructions to read and/or access the memory, in particular a flash memory. Accessing the memory may comprise writing to and/or controlling the memory as well as reading from the memory and/or calibrating the memory. The instructions set may comprise one or more flexible instructions.

An instruction set storage device may comprise any kind of memory arranged to store the instruction set, in a particular non-volatile memory. The memory of the instruction set storage device may be rewritable. The instruction set and/or one or more flexible instructions may be stored to be changeable. A change may be provided, e.g., when performing a firmware update and/or according to software running on a computing system on which the memory controller is implemented. Such software may, for example, be driver software and/or comprise a set of data or a database comprising parameters of a memory connected or connectable to the memory controller via a connection interface. A flexible instruction may be an instruction with flexible parameters and/or flexible parameter length. The flexible parameters and/or parameter length may be changeable in response to the memory connected or connectable via the connection interface. It may be envisioned that the instruction set comprises flexible instructions which may be adapted to an instruction set and/or timing of a memory connected to the memory controller via the connection interface.

The underlying concepts, and other aspects, of the invention are explained hereinafter with reference to specific embodiments and the FIGS. in the drawings, to which the above may be applied when suitable.

A memory controller may be provided which comprises a connection interface connected or connectable to a memory. The memory controller may be arranged to read data from the memory via the connection interface. As an example implementation the memory controller comprises a clock unit arranged to provide a data transfer clock signal having a first frequency, wherein the data transfer clock signal may be provided to the memory via the connection interface. The data transfer clock signal may be arranged for clocking a data transfer from the memory to the memory controller via the connection interface. The first frequency may be considered to be a data transfer signal frequency.

As an example implementation the memory controller comprises an oversampling circuit arranged to sample a calibration data pattern read by the memory controller via the connection interface at a second frequency to provide an oversampled calibration data pattern. The second frequency may be considered to be an oversampling frequency. The second frequency may be larger than the first frequency.

As an example implementation the memory controller is arranged to determine a timing shift of a data transfer from the memory to the memory controller based on the oversampled calibration data pattern. The memory controller may be arranged to write a reference data pattern and/or calibration data pattern into a memory location of the memory.

As an example implementation the memory controller is arranged to compare a calibration data pattern read from the memory with a stored reference data pattern and/or a reference data pattern indicated by a calibration instruction. As an example implementation the memory controller is arranged to indicate that an error has occurred if the reference data pattern and the calibration data pattern do not correspond. The reference data pattern may be stored in a suitable memory space of the memory controller, e.g. a reference register. It may be envisioned that a memory controller is arranged to write a reference data pattern into the memory, read it back at a later point in time as a calibration data pattern and to compare the calibration data pattern with the reference data pattern to determine whether the calibration data pattern is the expected data pattern. The memory may be a flash memory.

As an example implementation the memory controller is arranged to control the data transfer based on the oversampled calibration data pattern. In this context, shifting the timing of sampling of data by the memory controller and/or shifting a clock signal, in particular a data transfer clock signal, may be considered to be controlling the data transfer. For example, the memory controller may be arranged to shift a sampling window for sampling data read from the memory according to a timing shift determined based on the oversampled calibration signal to control data transfer. Accordingly, the use of analog or custom delay lines to calibrate the timing may be unnecessary. The memory controller may be arranged to compare the oversampled calibration data pattern with one or more shifted patterns to determine the timing shift of the data transfer. The shifted patterns may be stored in one or more suitable registers of the memory controller and/or may be generated based on a reference data pattern or calibration data pattern. Generating a shifted pattern may include expanding the data pattern according to the multiple N of oversampling and/or bit-wise shifting the signal to the right and/or left The memory controller may be arranged to store a timing shift value indicative of a determined timing shift in a status register. The status register may be a register of the memory controller. The connection interface may comprise a SPI-based bus. Such a bus requires a low number of pins, enabling a compact and low-powered connection between memory and memory controller. The connection interface may comprise a plurality of data pins for reading data from the memory. As an example implementation a calibration data pattern is transferred via such data pins. The oversampling circuit may comprise an oversampling unit arranged to oversample data for each of the data pins. In particular, As an example implementation the oversampling unit is arranged to individually sample each pin. The memory controller may comprise an instruction set having at least one calibration instruction according to which the memory controller reads the calibration data pattern from the memory and oversamples the calibration data pattern to provide an oversampled calibration data pattern.

As an example implementation the memory controller is arranged to turn on the oversampling circuit when carrying out the calibration instruction and/or to turn it off when the calibration instruction is finished. Alternatively or additionally, the memory controller may be arranged to drive the oversampling circuit with the oversampling frequency for calibration and with the data transfer signal frequency when calibration is not performed.

In an embodiment, a computing system may comprise a memory controller as described herein. The computing system may comprise a memory connected to the memory controller. As an example implementation the computing system comprises one or more processors or processor cores connected and/or associated to the memory controller. The memory controller may be implemented on the same die or integrated circuit as the one or more processors or cores. As an example implementation the memory controller and at least one processor are provided as a microcontroller unit. The computing system may be a computing system for mobile or automotive use or for industrial, consumer, networking or other applications. It may be envisioned that the computing system comprises a microcontroller for automotive applications and/or be implemented as a System-on-a-Chip. A processor may be a digital signal processor (DSP) or any kind of suitable processor, in particular an ARM-based processor.

There may be considered a method of calibrating data transfer of a memory system comprising a memory controller, in particular a memory controller as described herein, and a memory connected to the memory controller via a connection interface. The method may comprise reading, by the memory controller, a calibration data pattern from the memory via the connection interface according to a data transfer clock signal having a first frequency. The data transfer clock signal may be provided by a clock unit of the memory controller.

As an example implementation the method comprises sampling, by an oversampling circuit of the memory controller, the calibration data pattern with a second frequency higher than the first frequency to provide an oversampled calibration data pattern. The method may further comprise determining, by the memory controller, a timing shift of data transfer from the memory based on the oversampled calibration data pattern. It may be considered to compare the oversampled calibration data pattern with one or more shifted patterns to determine the timing shift of the data transfer. The data transfer may be controlled based on the oversampled calibration data pattern. Sampling data may at the oversampling frequency may be performed by the oversampling circuit or corresponding oversampling units of the oversampling circuit for each a plurality of data pins of the connection interface via which the calibration data pattern is read. The method may comprise storing a timing shift value indicative of a determined timing shift in a status register.

Generally, the method may be performed and/or the memory controller or computing system may be arranged or controlled to calibrate the data transfer depending on a temperature and/or a voltage. The memory controller and/or the computing system, in particular a microprocessor or an integrated circuit, e.g., a microprocessor or integrated circuit of a System-on-a-Chip, may be arranged to receive corresponding sensor signals. In particular, the memory controller and/or computing system may be arranged to perform calibration depending on a temperature change and/or a voltage change. Alternatively or additionally, the memory controller may be arranged to be controlled to perform calibration based on a corresponding control signal, which may, e.g., be provided by a processor of a computing system. It may be considered to perform calibration of data transfer for a memory system under a variety of different temperatures and/or voltages. In particular, there may be provided a look-up table indicating suitable status register values for given temperatures and/or voltages according to which a data transfer may be controlled. It may be considered to perform calibration and/or providing a look-up table when memory and memory controller are connected, before they are sold to End-Users. Alternatively or additionally, real-time calibration may be performed when the memory system or computing system is used, e.g., when starting the computing system and/or depending on temperature of voltage changes and/or in regular or irregular intervals.

Alternatively or additionally, a memory controller may be having a connection interface connected or connectable to a flash memory, the memory controller being arranged to read data from the flash memory via the connection interface. The memory controller may comprise an instruction set storage device arranged to store an instruction set of the memory controller, the instruction set comprising one or more flexible instructions to access and/or read the flash memory. The flexible instruction set may comprise at least one instruction to carry out the calibration method described herein. It may be conceived that the flexible instruction set comprises flexible instructions which may be adapted to an instruction set and/or timing of a memory connected to the memory controller via the connection interface. Generally, the memory controller may be a memory controller having any one or more of the features described herein. There may be considered a computing system with a corresponding memory controller.

Figure 1:
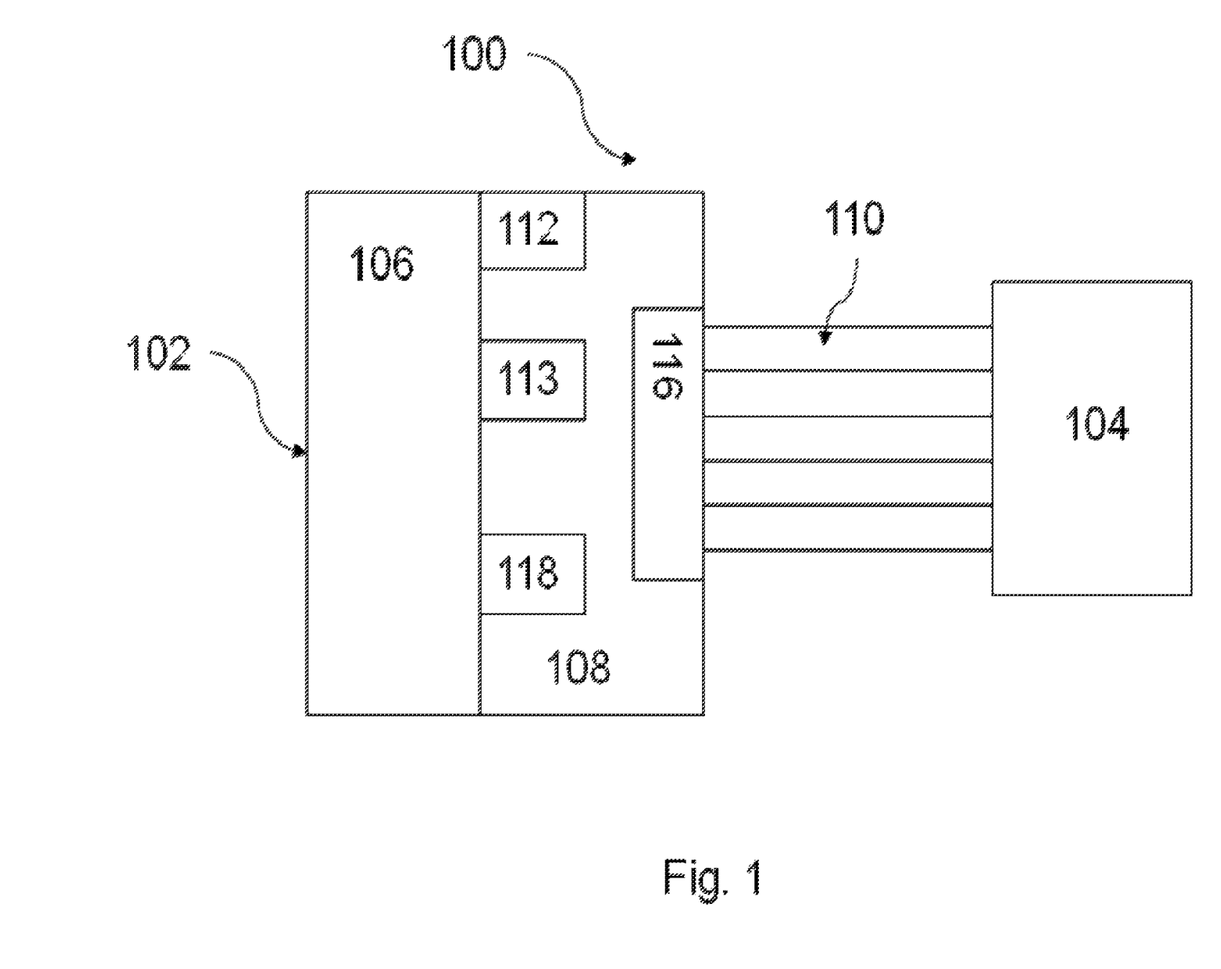
FIG. 1 schematically shows a block diagram of a computing system with a memory controller connected to a memory.

Now referring to the specific examples in the drawings, FIG. 1 schematically shows an example for a computing system 100. The computing system 100 may comprise a microcontroller unit 102 and a memory 104. The microcontroller unit 102 may comprise a processor 106, which may comprise one or more processor cores. The computing system 100 may comprise a memory controller 108, which in this example may be implemented on the same die as the processor 106 and which may be seen as part of the microcontroller unit 102. The memory controller 108 may be connected to the memory 104 via a connection interface 110 which may be an SPI interface-based bus. The connection interface 110 may comprise one or a plurality of data pins, in this example four data pins, which may be bidirectional. Alternatively, it may be conceived to arrange unidirectional lines for read access and/or write access to the memory 104. The connection interface 110 may comprise a clock pin providing a data transfer clock signal having a first frequency or data transfer signal frequency from the memory controller 108 to the memory 104. Optionally, the connection interface 110 may comprise a selection pin for selecting the memory 104 for data transfer. The memory controller 108 may comprise a clock unit 112 arranged to provide a data transfer clock signal. Based on the data transfer clock signal, data may be transferred to the memory controller and/or sampling of data transferred from the memory 104 via the connection interface 110 may be performed by the memory controller 108. It may be envisioned that the memory controller 108 comprises an instruction set storage device 113. The instruction set storage device 113 may be arranged to store a set of instructions of the memory controller 108. As an example implementation the memory controller 108 is arranged to carry out or execute the instructions of the instruction set, e.g., to read and/or access the memory 104. The instruction set may comprise one or more flexible instructions. Accordingly, the memory controller 108 may be provided without changes to its hardware independent of the type or manufacture of the memory 104 connected to it, as the flexible instructions of its instruction set may be adapted or changed to accommodate the instruction set and/or timing of the memory 104. The memory controller 108 may comprise a corresponding sampling circuit (not shown). It should be noted that due to small differences regarding the arrangement and/or conditions in which the individual lines or data pins of the connection device operate, there may be different shifts in timing for different pins. The memory controller 108 may comprise an oversampling circuit 116, which may comprise a plurality of oversampling units to individually oversample data received via the data pins of the connection interface 110. The oversampling circuitry may be arranged to sample data provided by the memory 104 at a second frequency or oversampling frequency that is higher than a first frequency provided by the data transfer clock signal. The memory controller 108 may comprise one or more registers 118. The registers 118 may comprise at least one status register in which a value indicating a timing shift may be stored. The registers 118 may comprise additional registers, in particular, oversampling registers and/or sample pattern registers. An oversampling register may be arranged to store the oversampled calibration data pattern. One or more sample pattern registers may be arranged to store shifted versions of the calibration data pattern. It may be envisioned that the memory controller 108 is arranged to compare the shifted patterns with the oversampled calibration data pattern to determine a timing shift. The memory controller 108 may be arranged to perform a calibration instruction to calibrate the data transfer via the complete data read path between the memory controller and the memory.

Figure 2:
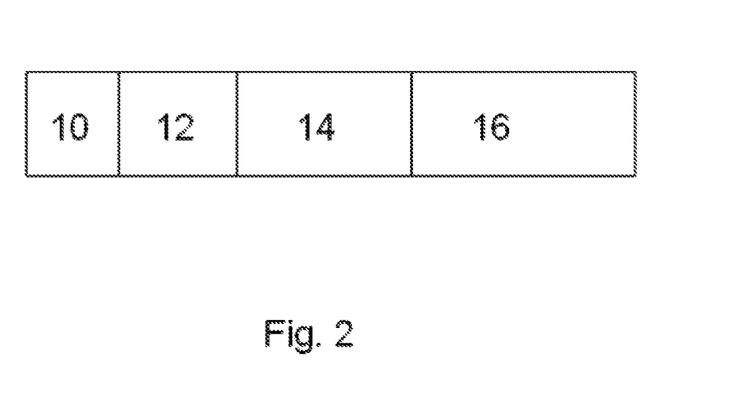
FIG. 2 schematically shows a flexible instruction for a memory controller.

An example of a possible structure of the calibration instruction is shown in FIG. 2. A calibration instruction may comprise a first block 10 with instruction information, e.g., an identifier of the instruction or an opcode, and a second block 12 with address information. The instruction may further comprise a third block 14 with mode information and/or delay payload, as well as a fourth block 16 with data information. The second block 12 may comprise a memory address or memory location from which a pre-programmed data pattern is to be read as calibration data pattern. The third block 14 may be arranged to contain mode information for accessing the memory, which may be defined by the standard of read access. In particular, the third block 14 may indicate in which mode an SPI-based bus may be operated to read data from memory. Additional parameters relevant to perform a read access may be included in the third block 14. Alternatively or additionally, the third block 14 may contain delay data or payload, allowing delay cycles for accessing memory and/or decoding and/or presenting data at corresponding pins. The optional fourth block 16 may comprise data information representing the data pattern to be read from the memory address, e.g. a reference data pattern. Thus, in block 16, there may be contained a copy of the data expected to be read from the pre-programmed memory location of the memory when carrying out the calibration instruction. The data pattern to be read as calibration data pattern may be written to a specific memory location before performing calibration. It may be considered to perform writing the data pattern to memory as part of the calibration, before it is read back to the memory controller. The data information in block 16 may be modifiable, e.g., it may be read from a reference register. Accordingly, the calibration instruction may be very flexible and utilize a variety of different data patterns for calibration. Generally, the calibration instruction may be considered to be a flexible instruction. In particular, the exact structure of the second block 12 and third block 14 may be dependent on the type of the memory 104, in particular on the instruction set and/or timing of the memory 104, which may be strongly dependent on its vendor or manufacturer. It may be envisaged that the calibration instruction may be adapted to the instruction set and/or timing of the memory 104, e.g., by a suitable software, which may be run on a computing system implementing the memory controller. The calibration instruction may be part of an instruction set of the memory controller 108, which may comprise one or more additional flexible instructions.

Figure 3:
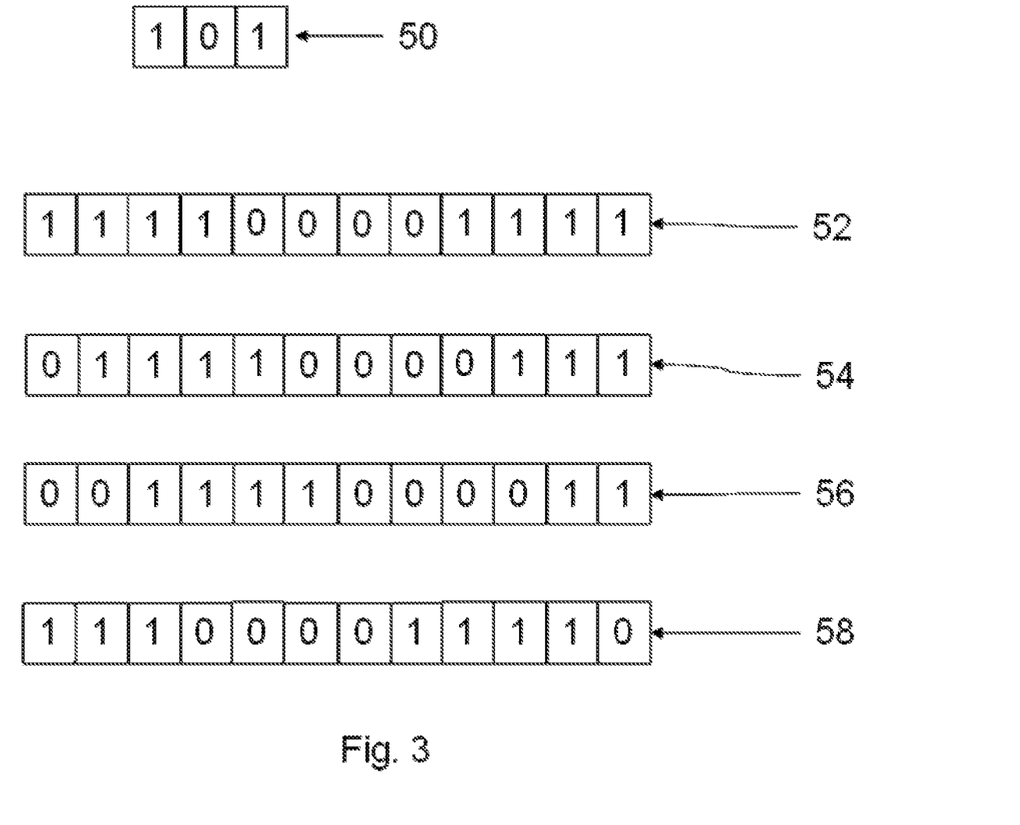
FIG. 3 schematically shows examples of a calibration data pattern and shifted patterns.

FIG. 3 schematically shows the effects of oversampling a calibration data pattern and possible sample data patterns. The calibration data may be sampled during a phase or window in which the data provided from the memory is valid. Generally, the calibration data may be oversampled with varying delays represented by shifts in the data pattern during time windows in which valid data is provided by the memory. As an example, a reference data pattern 50 which is written to memory may comprise the bit sequence "101". If the calibration data pattern is read correctly from memory, it should correspond to this reference data pattern. When oversampling a bit sequence with a factor of N, which in this example is 4, the length of the bit sequence is increase accordingly. Oversampling the calibration data pattern 50 with N=4 without timing shift would lead to the expanded data pattern 52, in which each bit of the sequence is quadrupled to read "111100001111". However, due to timing shifts the data pattern may be shifted by one or more bits to the left or the right. For example, data pattern 54 shows an expanded pattern shifted to right by one bit, data pattern 56 shows a shift to the right by two bits and data pattern 58 shows a shift to the left by one bit. The memory controller 108 may be arranged to compare the oversampled calibration data pattern with one or more shifted data patterns to determine how much the timing is shifted. As an example implementation the memory controller 108 comprises a corresponding comparator unit arranged to compare shifted data patterns with an oversampled calibration data pattern read from memory via the connection interface. Based on the comparison, a timing shift may be determined, a corresponding value of which may, e.g., be stored in a status register.

Figure 4:
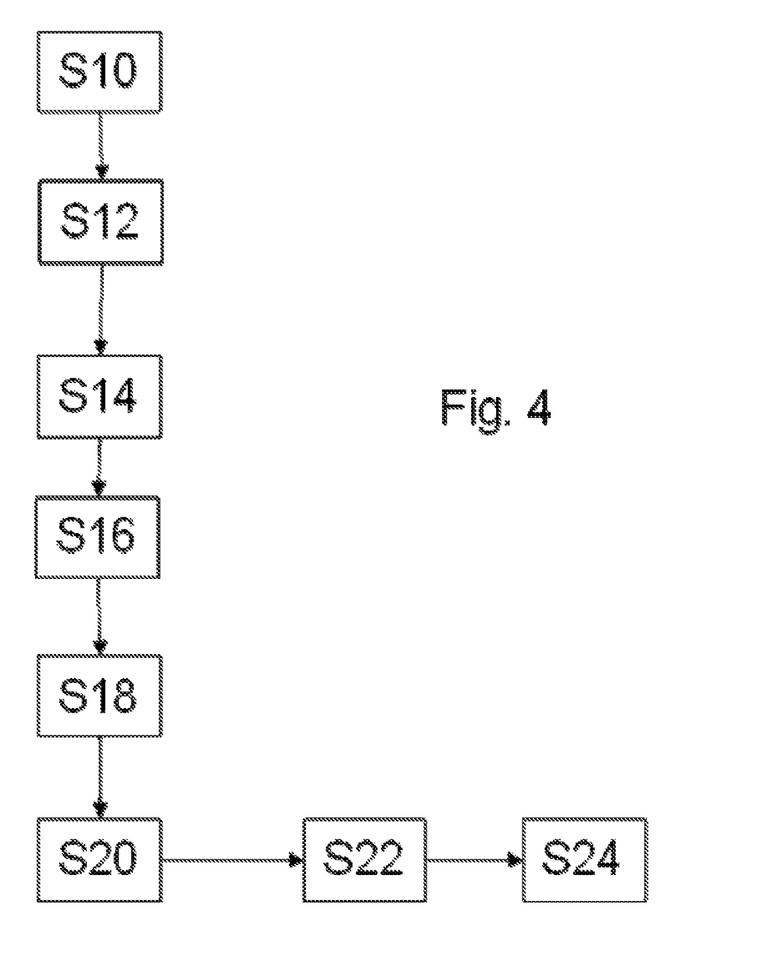
FIG. 4 schematically shows a flow diagram of a method of calibrating data transfer of a memory system.

FIG. 4 schematically shows a method for calibrating data transfer of a memory 104, which may be performed by a memory controller 108 connected to the memory 104, e.g., in a computing system 100 as shown in FIG. 1. In particular, the memory 104 may be a DDR serial flash memory connected to memory controller via a Serial Peripheral Interface or by a bus system based on a Serial Peripheral Interface. A memory controller 108 may carry out a flexible calibration instruction (S10). The flexible instruction may refer to carrying out a read access to a memory location in the memory 104 to read out a calibration data pattern. The memory controller 108 may selectively turn on an oversampling circuit 116 (S12).

As an example implementation the memory controller 108 reads the calibration data pattern from a pre-programmed memory location of the memory 104 (S14). The calibration data pattern may be provided via one or more data pins of the connection interface 110, e.g., serially or quasi-parallel. The oversampling circuit 116 may oversample the calibration data pattern, enabling determination of a timing shift of the data signal provided (S16). The oversampling circuit 116 may oversample the data provided by each data pin individually, enabling individually calibrating the sampling timing for each of the data pins via which data is transferred from the memory 104 to the memory controller 108. As an example implementation due to oversampling with a factor N, the data pattern provided by the oversampling circuitry is expanded in size by the same factor N. The memory controller 108 may compare the oversampled calibration data with sample patterns representing the possible shifts of data bits (S18). If one of the sample patterns is equal to the oversampled calibration data pattern, a matching signal may be provided (S20). Based on the matching signal and/or the sample pattern, a status register may be set to a value indicating a suitable timing shift leading to an optimized sampling of data transferred by the memory (S22). After oversampling the calibration data pattern has been performed, the oversampling circuit 116 may be turned off by the memory controller 108. Optionally, the calibration data pattern read may be compared to a reference data pattern indicated by the calibration instruction for error detection. It may be considered to control data transfer based on the timing shift determined, e.g., based on reading out the status register (S24)

Generally, the arrangements and methods described allow calibration and/or synchronization of a memory system for a complete read data path between a memory and a memory controller. The complete logic required to perform calibration may be arranged on the memory controller, such that the method can be performed with any memory the memory controller may read and/or write to, without requiring additional changes to the memory or specific knowledge of the arrangement or manufacture of the memory. In particular, the method and memory controller may be used to calibrate a memory system independent of the vendor of the memory. The calibration is fast and does not disturb use of the computing system. Also, every memory system may be calibrated individually with a small amount of effort, improving the performance of memory systems individually.

In the foregoing specification, the invention has been described with reference to specific examples of embodiments of the invention. It will, however, be evident that various modifications and changes may be made therein without departing from the broader scope of the invention as set forth in the appended claims which accordingly are not limited to the specific example described.

For example, the memory may be implemented as any kind of semiconductor-based memory, e.g. flash memory. The memory generally may comprise or be a volatile or non-volatile memory, e.g. a RAM (random access memory). In particular, the memory may comprise or be a flash memory, e.g. a NOR-flash memory or a NAND-flash memory. The memory may be connected or connectable to the memory controller via a connection interface. The memory may e.g. be a DDR memory, in particular a DDR flash memory. Furthermore, the memory may be separate from the memory controller and e.g. be external to an integrated circuit package in which the memory controller is provided. For example, the memory controller and the memory may be arranged on different dies and/or substrates The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

For transferring data, specific conductivity types or polarity of potentials may be used according to the relevant standards. It will be appreciated that any suitable kind of conductivity types and polarities of potentials may be used.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the oversampling circuit may be implemented with the memory controller or arranged separately.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the memory controller may be arranged integrally with a processor, e.g., as a SOC. Alternatively, the examples may be implemented as any number of separate integrated circuits or separate devices interconnected with each other in a suitable manner. For example, the memory controller may be implemented as a separate component.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:
1. A memory controller, comprising:
a connection interface connected or connectable to a memory, the memory controller being arranged to read data from the memory via the connection interface;
a clock unit arranged to provide a data transfer clock signal having a first frequency, wherein the data transfer clock signal is provided to the memory via the connection interface, the data transfer clock signal being arranged for clocking a data transfer from the memory to the memory controller via the connection interface;
an oversampling circuit arranged to sample a calibration data pattern read by the memory controller via the connection interface at a second frequency to provide an oversampled calibration data pattern, the second frequency being larger than the first frequency, and wherein the calibration data pattern includes a predetermined sequence of bits;

wherein the memory controller is arranged to determine a timing shift of a data transfer from the memory to the memory controller based on the oversampled calibration data pattern.

2. The memory controller of claim 1, wherein the memory is a flash memory.

3. The memory controller of claim 1, the memory controller being arranged to control the data transfer based on the oversampled calibration data pattern.

4. The memory controller of claim 1, the memory controller being arranged to compare the oversampled calibration data pattern with one or more shifted patterns to determine the timing shift of the data transfer.

5. The memory controller of claim 1, the memory controller being arranged to store a timing shift value indicative of a determined timing shift in a status register.

6. The memory controller of claim 1, the connection interface comprising a Serial Peripheral Interface-based bus.

7. The memory controller of claim 1, the connection interface comprising a plurality of data pins for reading data from the memory.

8. The memory controller of claim 7, the oversampling circuit comprising an oversampling unit arranged to oversample data for each of the data pins.

9. The memory controller of claim 1, the memory controller comprising an instruction set having at least one calibration instruction according to which the memory controller reads the calibration data pattern from the memory and oversamples the calibration data pattern to provide an oversampled calibration data pattern.

10. A method of calibrating data transfer of a memory system having a memory controller, and a memory connected to the memory controller via a connection interface, comprising:

reading, by the memory controller, a calibration data pattern from the memory via the connection interface, according to a data transfer clock signal having a first frequency provided by a clock unit of the memory controller, wherein the calibration data pattern includes a predetermined sequence of bits;

sampling, by an oversampling circuit of the memory controller, the calibration data pattern with a second frequency higher than the first frequency to provide an oversampled calibration data pattern; and determining, by the memory controller, a timing shift of data transfer from the memory based on the oversampled calibration data pattern.

11. The method of claim 10, further comprising comparing the oversampled calibration data pattern with one or more shifted patterns to determine the timing shift of the data transfer.

12. The method of claim 11, further comprising controlling the data transfer based on the oversampled calibration data pattern.

13. The method of claim 11, further comprising oversampling data for each a plurality of data pins of the connection interface via which the calibration data pattern is read.

14. The method of claim 11, further comprising storing a timing shift value indicative of a determined timing shift in a status register.

15. A memory controller, comprising:

a connection interface connected or connectable to a flash memory, the memory controller being arranged to read data from the flash memory via the connection interface;

an instruction set storage device arranged to store an instruction set of the memory controller, the instruction set comprising one or more flexible instructions to access the flash memory, wherein the memory controller, in response to at least one instruction of the flexible instruction set, is configured to:

read a calibration data pattern from the flash memory via the connection interface, according to a data transfer clock signal having a first frequency provided by a clock unit of the memory controller, wherein the calibration data pattern includes a predetermined sequence of bits;

sampling the calibration data pattern with a second frequency higher than the first frequency to provide an oversampled calibration data pattern; and determining a timing shift of data transfer from the memory based on the oversampled calibration data pattern.

16. The memory controller of claim 15, the flexible instruction set comprising flexible instructions which are adapted to an instruction set or timing of the flash memory.

17. The memory controller of claim 15, wherein the memory controller, in response to the at least one instruction, is configured to compare the oversampled calibration data pattern with one or more shifted patterns to determine the timing shift of the data transfer.

18. A memory system, comprising:
a memory controller according to claim 1; and
a memory connected to the memory controller via the connection interface.

19. A computing system, comprising:
a memory controller as claimed in claim 1 and a microcontroller.

* * * * *